United States Patent [19]

Yamamoto et al.

[11] Patent Number: 4,851,254

[45] Date of Patent: Jul. 25, 1989

[54] METHOD AND DEVICE FOR FORMING DIAMOND FILM

[75] Inventors: Minoru Yamamoto, Nishio; Nobuei Ito, Okazaki; Hiroshi Uesugi, Nishio; Tadashi Hattori, Okazaki, all of Japan

[73] Assignee: Nippon Soken, Inc., Nishio, Japan

[21] Appl. No.: 142,813

[22] Filed: Jan. 11, 1988

[30] Foreign Application Priority Data

Jan. 13, 1987 [JP] Japan ................................. 62-5527
Oct. 12, 1987 [JP] Japan ............................... 62-256805

[51] Int. Cl.$^4$ ............................................. B05D 3/06
[52] U.S. Cl. ....................................... 427/37; 427/34
[58] Field of Search ................. 427/37, 34; 118/50.1, 118/620

[56] References Cited

U.S. PATENT DOCUMENTS

| | | | |
|---|---|---|---|
| 4,452,686 | 6/1984 | Axenov | 118/50.1 |
| 4,565,618 | 1/1986 | Banks | 427/34 |
| 4,645,977 | 2/1987 | Kurokawa | 118/50.1 |
| 4,698,256 | 10/1987 | Giglia | 427/34 |

FOREIGN PATENT DOCUMENTS 1163849  7/1986  Japan ................................. 427/34

OTHER PUBLICATIONS

H. Vora and T. J. Moravec, "Structural Investigation of Thin Films of Diamond Like Carbon", J. Appl. Phys., 52(10), Oct., 1981, pp. 6151–6157.

*Primary Examiner*—Shrive Beck
*Assistant Examiner*—Vi Duong Dang
*Attorney, Agent, or Firm*—Cushman, Darby & Cushman

[57] ABSTRACT

A device for forming a diamond film has a casing in which a vacuum is maintained to 50 Torr: a positive electrode and a negative electrode are disposed within the casing so that ends of the positive electrode and the negative electrode are opposed to each other through a space: a substrate is disposed near the space between the electrodes, a gas inlet pipe supplies a mixture gas of hydrogen, argon and methane to the space between the electrodes and an arc power supply is connected to the electrodes for supplying a predetermined arc output power thereacross to form an arc discharge column in the space therebetween. By supplying the mixture gas to the arc discharge column of which the temperature is extremely high, the mixture gas is decomposed at a high rate, and a diamond film of high purity grows on the substrate at a high speed.

11 Claims, 4 Drawing Sheets

RAMAN SPECTRUM 1333 (cm⁻¹)

METHOD AND DEVICE FOR FORMING DIAMOND FILM

BACKGROUND OF THE INVENTION

1. Field of the Invention

The present invention relates to a forming method of a diamond film and a device for forming the diamond film, and more particularly to a method and a device for forming a diamond film under a comparatively low pressure by making use of an arc discharge.

2. Description of the Prior Art

Conventionally, diamond has been formed by processing carbon powder such as graphite powder in the presence of metallic catalyst at a high temperature and under a ultra-high pressure.

Recently, methods for forming diamond under a low pressure have been noted in place of the above described conventional method. And such methods by which diamond is practically formed, can be roughly classified into following three types of method.

A first type of method is called a heat filament chemical vapour deposition (CVD) method. According to this method, a tungsten filament is disposed just above a substrate which is heated at 800° through 1000° C., this filament is heated at 2000° C. or more, and a mixture gas of hydrogen and hydrocarbon such as methane is sprayed to the substrate through the heated filament thereby to grow a diamond film on the substrate.

A second type of method is called a microwave plasma CVD method. According to this method, a plasma is generated in a mixture gas of hydrogen and hydrocarbon by the function of microwave of hundreds wat to grow a diamond film on a substrate which is positioned within the generated plasma. At this time. the substrate is heated by the microwave to about 700° though 900° C. High frequency wave plasma generated by high frequency wave of 13.56 MHz can be substituted for the above described microwave plasma.

In the above described two types of methods, atomic hydrogen accelerates the decomposition of methane and prevents the formation of other synthetic material such as amorphous carbon selectively.

A third type of method is a method using ion beam. According to this method, a diamond film is grown on the substrate by irradiating the substrate with ion beam of carbon. In this case, an arc discharge can be used for generating the ion beam (Japanese unexamined patent publication Sho 58-91100).

The above described conventional forming methods of the diamond film have following problems. Namely, in the heat filament CVD method, the heated filament is broken at not less than 2000° C. which is the melting point of tungsten. Accordingly, sufficient decomposition of the mixture gas cannot be realized so as to be not practical.

In the microwave plasma CVD method, the size of a plasma chamber is restricted and accordingly, it is difficult to apply this method to samples of a large area. Furthermore sufficient decomposition of the mixture gas, particularly hydrogen gas cannot be obtained.

By the forming method by ion beam, it has not been reported that diamond of high purity is formed. Only diamond containing a large amount of impurity such as amorphous carbon is formed.

SUMMARY OF THE INVENTION

It is an object of the present invention to provide a method for efficiently forming a diamond film of high purity at a high decomposition rate of gases.

The method for forming a diamond film on a substrate, according to the present invention has the steps of supplying an arc output power across a positive electrode and a negative electrode which are opposed to each other, to form an arc discharge area, supplying a plasma source gas and a carbon source gas to the arc discharge area to form a gas plasma, and supplying the gas plasma onto the substrate provided near the positive electrode and the negative electrode.

And the device for forming a diamond film on a substrate, according to the present invention has a casing of which the vacuum is maintained to a predetermined value, a positive electrode and a negative electrode which are disposed within the casing so as to be opposed to each other, a substrate disposed near a space formed between the positive electrode and the negative electrode, an arc power source connected to the positive electrode and the negative electrode for supplying a predetermined output power thereacross and forming an arc discharge area in the space, plasma source gas supplying means provide with an outlet port which opens near the space on the side opposite to the substrate for supplying a plasma source gas to the arc discharge area to form a gas plasma and carbon source gas supplying means provided with an outlet port for supplying a carbon source gas to the gas plasma.

According to the method and the device of the present invention, arc output power of dozens of voltage is supplied across the opposed electrodes within a low pressure atmosphere such as a few Torr to a few atmosphere to generate an arc disharge area of which the temperature of thousands to tens of thousands of degrees. By supplying the plasma source gas and the carbon source gas to the arc discharge area, these gases are dissociated at a high rate, and accordingly a diamond film of high purity is growed on the substrate at a high speed.

DETAILED DESCRIPTION OF THE EMBODIEMNTS

Hereinafter, the present invention will be explained in accordance with embodiments with reference to the drawings.

Figure 1:
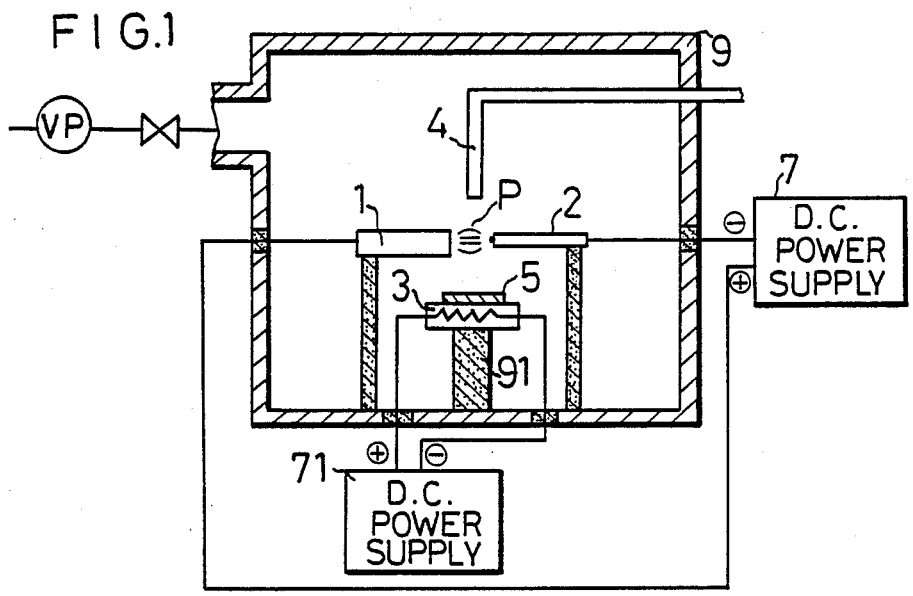
FIG. 1 is a schematic sectional view of a first embodiment of a diamond film forming device according to the present invention.

In the first embodiment of the diamond film forming device shown in FIG. 1, a positive electrode 1 and a negative electrode 2 are disposed so as to be opposed to each other within a casing 9 of which the vacuum is maintained to $10^{-2}$ Torr by means of a vacuum pump VP and a sample bed 91 is disposed just below a space where an arc plasma P is generated, at a distance of about 20 mm. The positive electrode 1 has a diameter larger than that of the negative electrode 2.

A substrate 5 made of tungsten is supported by the sample bed 91. The surface of the substrate 5 is previously ground so as to form scratches thereon for facilitating the formation of diamond.

An inlet pipe 4 is provided just above the space where the arc plasma P is generated, for introducing a mixture gas of a carbon source gas and an operating gas. The mixture gas reaches the substrate 5 after passing the arc plasma P. The counter electrodes 1 and 2 are connected to an arc power supply 7, respectively, and the substrate 5 is maintained to a predetermined temperature (about 800° C.) by means of a heater 3 connected to a heater power supply 71.

The method for forming a diamond film using the above described device of the first embodiment will be explained.

At first, the casing 9 is exhausted, and then gas of group 0 of the periodic table, such as argon gas is introduced into the casing 9 through the inlet pipe 4 to maintain the inner pressure of the casing 9 to 50 Torr. Thereafter, an arc discharge is generated between the electrodes 1 and 2 by means of the arc power supply 7, and after the arc discharge becomes stable, a mixture gas containing 50 vol % of argon gas, 49 vol % of hydrogen gas and 1 vol % of methane gas is made flow into the casing 9 through the inlet pipe 4 at the flow rate of 100 cc/min. At this time, the casing 9 is continuously exhausted to maintain the inner pressure to 50 Torr. The positive electrode 1 is composed of a carbon rod of which the diameter is 15 mm and the negative electrode 2 is composed of a carbon rod of which the diameter is 5 mm. And the arc discharge is generated at an output power of 20 V and 40 A. As the arc discharge proceeds, the temperature exceeds 3000° C. in the vicinity of the base end of the negative electrode 2. From this result, the temperature of a gas within a positive column can be presumed to rise over such a temperature.

As a result of one hour-arc discharge, an attachment is formed on the substrate 5.

Figure 2:
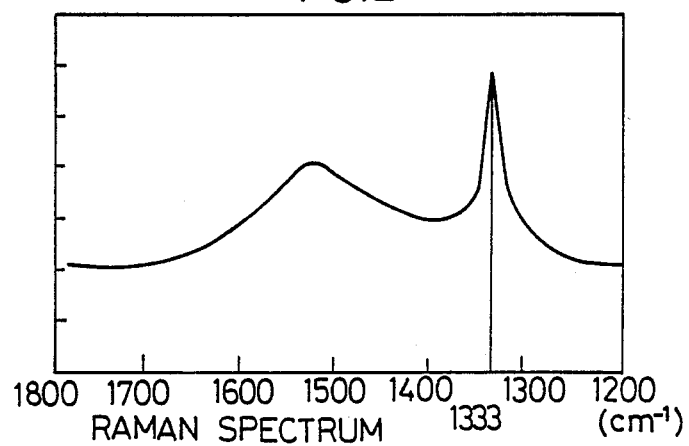
FIG. 2 is a graph showing Raman spectrum of the first embodiment.

The attachment formed on the substrate 5 is observed by means of a Raman spectroscope and an electron microscope. As a result, as shown in FIG. 2, a Raman peak of 1333 cm$^{-1}$, which shows the existence of diamond, is observed. And by means of the electron microscope, a crystal particle image of which the crystal shape is similar to that of a diamond particle formed by the conventional microwave plasma CVD method or the like is observed.

In contrast, by means of the conventional microwave plasma CVD method, any diamond particle is not observed after 1 hr of arc discharge. And it takes 3 hr or more until the diamond grows and the Raman peak is observed.

And by the forming method of the 1st embodiment, diamond grows at a growing speed of 5 through 10 μm/hr, which is 10 to 20 times as high as that of the conventional forming method.

This experimental result shows that by the method of the first embodiment, diamond is formed at a high growing speed as compared with the conventional method. Furthermore, according to the first embodiment, there is no such a trouble that the filament is broken as is encountered in the conventional heat filament method.

Figure 3:
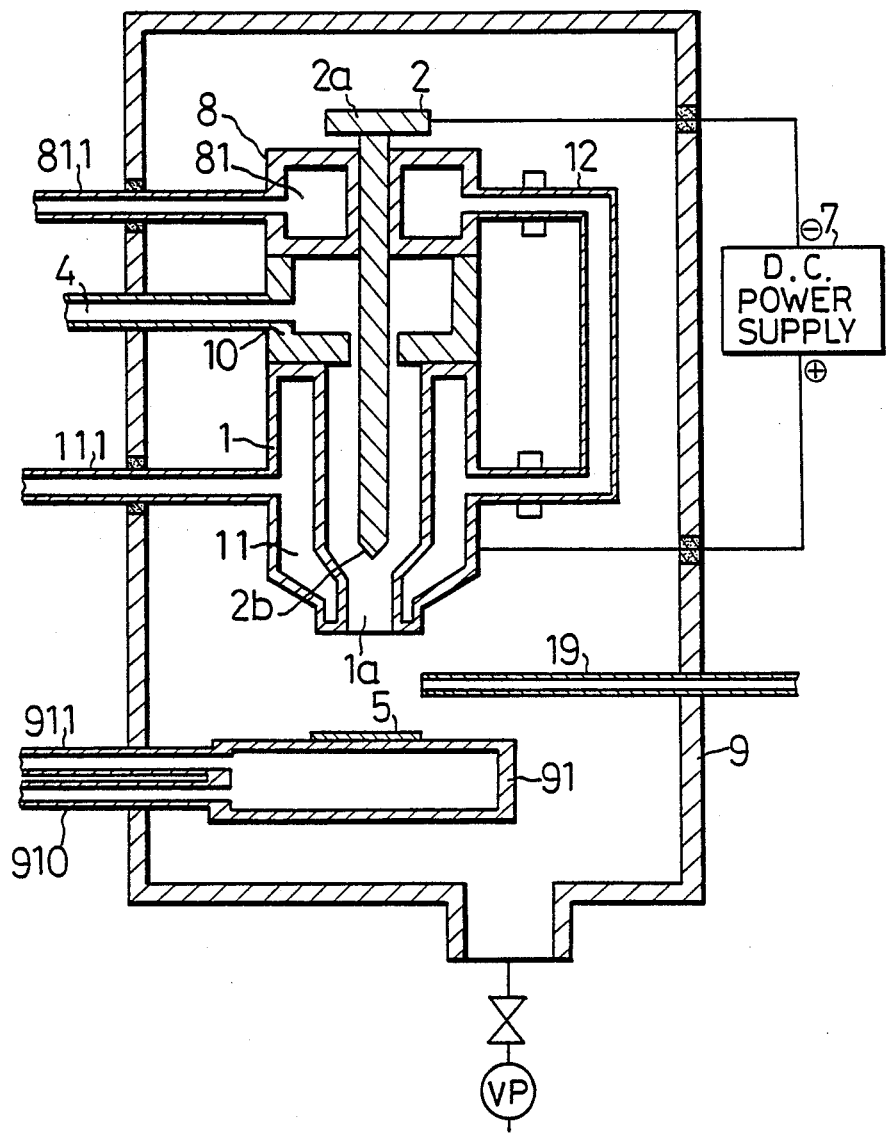
FIG. 3 is a schematic sectional view of a second embodiment of a diamond film forming device according to the present invention.

FIG. 3 is a shcematic sectional view of a second embodiment of a device for forming a diamond film.

In FIG. 3, a positive electrode 1 is composed of a cylindrical body made of copper and a negative electrode 2 is composed of a tungsten rod having a flange portion 2a and an acute-angled tip end 2b which is inserted into the cylindrical positive electrode 1. The diameter of the tungsten rod is 4 mm. Around the upper portion of the negative electrode 2 is provided an electrode cooling portion 8 made of copper.

A gas inlet portion 10 made of polytetrafluoroetylene is provided around the negative electrode 2 between the electrode cooling portion 8 and the positive electrode 1. The positive electrode 1 and the electrode cooling portion 8 are provided with hollow portions 11 and 81, respectively. The hollow portions 11 and 81 are communicated with each other through a cooling water pipe 12. A cooling water is supplied to the hollow portion 11 of the positive electrode 1 from a cooling water inlet pipe 111 and flows into the hollow portion 81 of the electrode cooling portion 8 through the cooling water pipe 12. And then, the cooling water is discharged from a cooling water outlet pipe 811 connected to the electrode cooling portion 8. This cooling water prevents the damage or wear of the electrodes due to the heat of the arc discharge generated between the electrodes 1 and 2.

The gas inlet portion 10 is provided with a gas inlet pipe 4, and a lower end wall of the gas inlet portion 10 is provided with a cylindrical opening around the negative electrode 2. Gas supplied from the gas inlet pipe 4 is supplied into an inner space of the positive electrode 1 towards the tip end 2n of the negative electrode 2 through the cylindrical opening of the gas inlet portion 10.

An electric power supply 7 for arc discharge is connected to the electrodes 1 and 2 for generating an arc discharge therebetween. And the positive electrode 1 is throttled at its lower end to form a plasma jet port 1a having an inner diameter of 8 mm.

A substrate 5 is disposed on a sample bed 91 directly below the plasma jet port 1a at a distance of 10 mm. The substrate 5 is made of tungsten and the surface thereof is previously ground to form fine scratches thereon for facilitating the formation of a diamond film.

The sample bed 91 is made hollow for cooling the substrate 5 to a predetermined temperature (about 800° C. in this embodiment) by a cooling water supplied from a cooling water inlet pipe 910 and discharged out of a cooling water outlet pipe 911.

The temperature of the plasma jet jetted from the plasma jet port 1a reaches thousands to tens of thousands of degrees. In contrast, the temperature at which diamond is formed is as low as 600° through 1100° C. Therefore, the substrate 5 must be cooled to such a diamond forming temperature.

In addition, a carbon source gas inlet pipe 19 is provided between the plasma jet port 1a and the substrate 5 and a vacuum pump VP is provided to maintain the vacuum of a casing 9 to a predetermined value.

Hereinafter, the forming method of a diamond film using the device of the second embodiment of the present invention will be explained.

After the casing 9 is discharged to $10^{-2}$ Torr, argon gas is introduced into the positive electrode 1 through the gas inlet pipe 4 to maintain the inner pressure of the casing 9 to 50 Torr. Thereafter, an arc discharge is generated between the electrodes 1 and 2 by means of the arc discharge power supply 7 at an output power of 30 V and 40 A, 60 A, 80 A.

When the arc discharge becomes stable, mixture gas composed of 80 vol % of argon gas and 20 vol % of hydrogen gas is supplied into this arc discharge at the flow rate of 5000 cc/min from the gas inlet pipe 4 to form a gas plasma.

During the arc discharging time, the casing 9 is continuously discharged so as to maintain the inner pressure to 50 Torr.

The obtained gas plasma is made to pass the plasma jet port 1a to form a plasma jet. Then, methane gas is introduced from the carbon source gas inlet pipe 19 at the flow rate of 50 cc/min and is sprayed to this plasma jet to form a gas plasma jet of purplish red. This gas plasma jet is sprayed to the substrate 5 for 30 minutes to form a diamond thereon.

At this time, the temperature of the center of the plasma reaches 3000° C. or more, and the temperature of the discharge portion formed between the electrodes is raised to not less than such a temperature.

The obtained diamond film is observed by means of a Raman spectroscope and an electron microscope similarly to the first embodiment.

Figure 4:
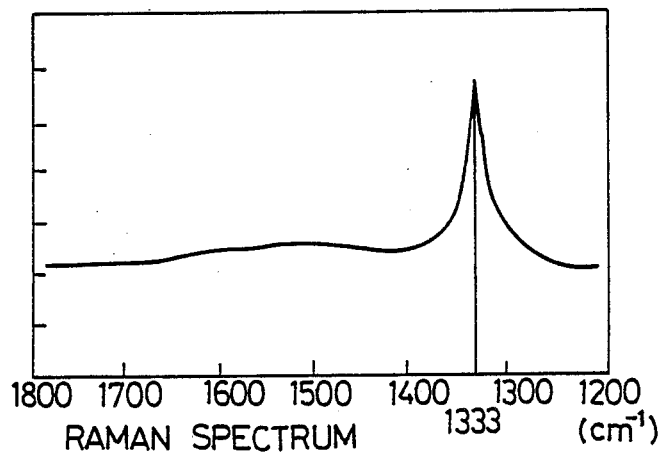
FIG. 4 is a graph showing Raman spectrum of the second embodiment.

FIG. 4 shows an obtained Raman spectrum of the second embodiment. This Raman spectrum also exhibits a Raman peak of 1333 cm$^{-1}$, which shows the existence of, as a result of the observation by the electron microscope, a crystal particle image similar to that of the first embodiment is also observed.

According to the second embodiment, a diamond film can be observed after an arc discharging time as short as 30 minutes, and the experimental result shows that the growing speed of diamond is as high as 30 $\mu$m/hr. Therefore, the device and the method of the second embodiment exhibit operation effect superior to not only the conventional device and method but also the first embodiment.

Figure 5:
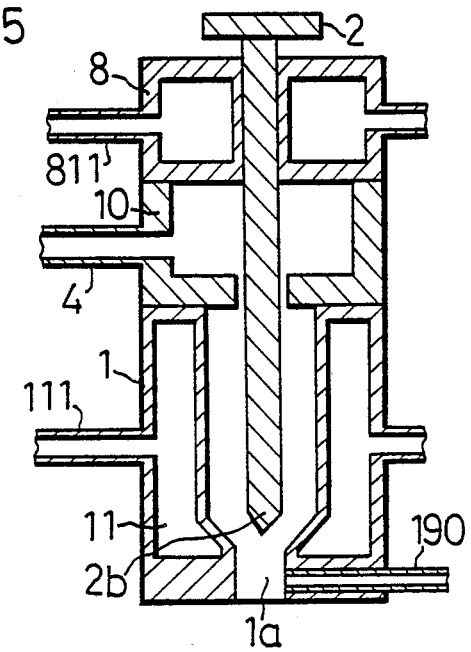
FIG. 5 is a schematic sectional view of a third embodiment of a diamond film forming device according to the present invention.

FIG. 5 illustrates a third embodiment of the device according to the present invention.

In the third embodiment, a carbon source gas inlet pipe 190 is provided in a bottom wall of the positive electrode 1 so as to penetrate it and open directly above the plasma jet port 1a, and a cooling water pipes 111 and 811 are independently provided in the positive electrode 1 and the electrode cooling portion 8. The substrate 5 is disposed just below the plasma jet port 1a at a distance of 5 mm. The other structure of the third embodiment is substantially equal to that of the second embodiment.

The forming method according to the third embodiment is as follows:

The casing 9 is firstly discharged and an arc discharge is generated between the positive electrode 1 and the negative electrode 2 in the similar manner to that of the second embodiment.

After the arc discharge becomes stable, a mixture gas composed of argon and hydrogen is introduced from the gas inlet pipe 4 into the gas inlet portion 10 to be formed into a gas plasma. And methane gas is introduced from the carbon source gas inlet port 190 into the plasma jet port 1a at the flow rate of 50 cc/min. This methane gas is mixed with the gas plasma and is jetted out of the plasma jet port 1a as a gas plasma jet. The obtained gas plasma jet is sprayed to the substrate 5 thereby to form a diamond film thereon. In this case, the volume ration of argon gas, hydrogen gas and methane gas is 80:19:1.

Furthermore, the inner pressure of the casing 9 is maintained to 50 Torr by means of a pressure control value (not shown) similarly to the second embodiment.

In the third embodiment, the arc disharge is continued for 30 minutes at an output power of 30 V and 60 A, and an attachment formed on the substrate 5 is observed by means of a Raman spectroscope and an electron microscope similarly to the preceding embodiments.

As a result of 30 minutes arc discharge, the obtained Raman spectrum exhibits a Raman peak of 1333 cm$^{-1}$, which shows the existence of diamond, and an image of a multiple crystals film is observed by the electron microscope.

In the forming method of the third embodiment, diamond grows at a growing speed of 30 $\mu$m/hr, which is about 60 times as large as the growing speed of the conventional microwave plasma CVD method.

Therefore, according to the third embodiment, a forming method by which a diamond film is formed at a high growing speed can be obtained similarly to the second embodiment.

Furthermore, according to the third embodiment, by providing the carbon source gas inlet pipe so as to open in the plasma jet port, the carbon source gas can be easily mixed with the plasma gas to increase the diamond growing speed.

Figure 6:
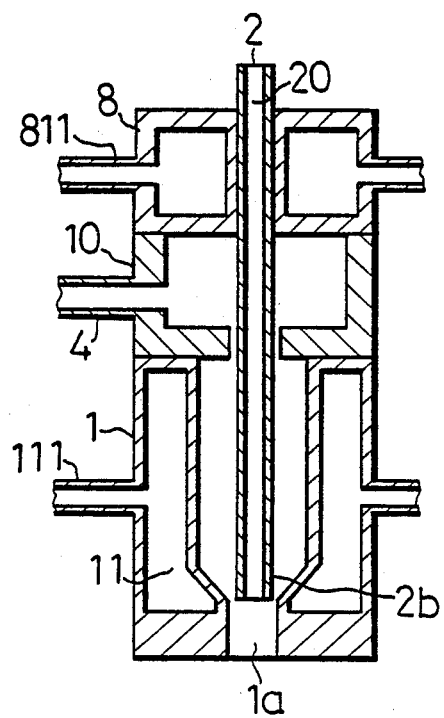
FIG. 6 is a schematic sectional view of a fourth embodiment of a diamond film forming device according to the present invention.

FIG. 6 illustrates a fourth embodiment of a device according to the present invention.

In the fourth embodiment, an inner passage 20 is formed in the negative electrode 2 so as to open at its tip end 2b. And methane gas is introduced into the plasma jet port 1a through the inner passage 20.

The other structure of the device of the fourth embodiment is substantially equal to that of the second embodiment.

According to the fourth embodiment, a diamond film can be formed on the substrate 5 similarly to the second and third embodiments.

According to the second, third and fourth embodiments, the carbon source gas and the plasma source gas are separately supplied since the negative electrode is made of tungsten, which is easily carbonized and becomes brittle in contact with the mixture gas thereof. If the negative electrode is made of other material such as carbon, it is unnecessary to separately supply such gases, and other kind of mixture gas such as the mixture of argon gas, and hydrogen gas with hydrocarbon gas or organic compound gas can be introduced together.

Furthermore, in the second, third and fourth embodiments, the substrate 5 is disposed on the sample bed 91. Instead, the substrate 5 may be brazed to the sample bed 91. In this case, the heat conduction between the substrate 5 and the sample bed 91 is improved and the cooling effect of the substrate 5 is also improved.

As described above, according to the device and the method of the present invention, a diamond film can be formed at a high diamond growing speed by generating gas plasma or gas plasma jet due to arc discharge, and spraying the generated gas plasma or gas plasma jet to the substrate.

In the present invention, 80 to 100 vol % of argon gas as gas of group 0 of the periodic table is introduced at the start of the arc discharge for facilitating the start of the arc discharge. And argon gas is also introduced with hydrogen gas for stabilizing the arc discharge after the start of the arc discharge to enable the formation of diamond over a long time. In this case, the introduction of 5 to 95 vol % of argon gas exhibits good effect and the introduction of 30 vol % to 90 vol % of argon gas exhibits remarkably good effect.

In the present invention, the substrate is made of tungsten, The substrate can be made of other material such as silicon.

In the present invention, methane gas is used as the carbon source gas. This carbon source gas may be formed from an organic compound such as acetone, alcohol, and amine, or other hydrocarbon such as propane. In addition, a mixture gas composed of the above described material with hydrocarbon may be used.

In the present invention, the vacuum within the casing is maintained to 50 Torr during the diamond forming time. The vacuum is not limited to this value. The diamond can be formed under an atmospheric pressure of 10 Torr to several atmosphere.

The flow rate of gases to be introduced into the casing is not limited to the above described values. Our experimental result shows that the preferable flow rate of gases is 50000 to 100 cc/min of argon, 20000 to 50 cc/min of hydrogen and 10000 to 1 cc/min of methane.

Furthermore, the output power to be applied for generating the arc discharge is not limited to the disclosed value. The preferable output power for arc discharge may be selected from the values ranged from 30 V and 5 A to 30 V and 100 A.

The electric power supply for arc discharge is not limited to the direct-current power supply. An alternate-current power supply can be substituted therefor.

What is claimed is:

1. A method for forming a diamond film, comprising the steps of:

supplying an arc output power from a direct current power supply across a positive electrode and a negative electrode which are opposed to each other, to form an arc discharge area;

supplying a plasma source gas including hydrogen, and carbon source gas to said arc discharge area under a pressure of 10 Torr to several atmosphere to form a gas plasma; and supplying said gas plasma onto a substrate provided near said positive electrode and said negative electrode thereby to form a diamond film on said substrate.

2. A method as claimed in claim 1, wherein said carbon source gas includes one of hydrocarbon and organic compound.

3. A method as claimed in claim 1, wherein said plasma source gas further includes gas of group 0 of the periodic table.

4. A method as claimed in claim 3, wherein said plasma source gas includes 80 to 100 vol % of argon at the start of supply of said arc output power, and 5 to 95 vol % of argon after the formation of said arc discharge area.

5. A method as claimed in claim 3, wherein said plasma source gas includes 80 to 100 vol % of argon at the start of supply of said arc output power, and 30 to 90 vol % of argon after the formation of said arc discharge area.

6. A method as claimed in claim 1, wherein said plasma source gas and said carbon source gas are supplied together.

7. A method as claimed in claim 1, wherein said plasma source gas and said carbon source gas are supplied separately.

8. A method as claimed in claim 1, further comprising the steps of throttling said gas plasma into a gas plasma jet and spraying said gas plasma jet onto said substrate.

9. A method as claimed in claim 2 wherein said hydrocarbon is one of methane and propane.

10. A method as claimed in claim 2, wherein said organic compound is one of acetone, alcohol and amine.

11. A method as claimed in claim 1, wherein said arc output power is ranged from 30 V and 5 A, through 30 V and 100 A.

* * * * *